United States Patent [19]

Abeles et al.

[11] Patent Number: 4,872,744

[45] Date of Patent: Oct. 10, 1989

[54] SINGLE QUANTUM WELL OPTICAL MODULATOR

[75] Inventors: Joseph H. Abeles, Highland Park; Alexander Kastalsky, Wayside; Robert F. Leheny, Little Silver, all of N.J.

[73] Assignee: Bell Communications Research, Inc., Livingston, N.J.

[21] Appl. No.: 144,817

[22] Filed: Jan. 15, 1988

[51] Int. Cl.$^4$ .............................................. G02F 1/015
[52] U.S. Cl. ..................................... 350/356; 350/355
[58] Field of Search ...................... 350/355, 354, 356; 357/22 A, 22 MD

[56] References Cited

U.S. PATENT DOCUMENTS

| | | | |
|---|---|---|---|
| 3,884,732 | 5/1975 | Baitinger | 357/45 X |
| 4,525,687 | 6/1985 | Chemla et al. | 332/7.51 |
| 4,528,464 | 7/1985 | Chemla et al. | 307/425 |
| 4,549,788 | 10/1985 | Chemla et al. | 350/354 |
| 4,590,502 | 5/1986 | Morkoc | 357/22 A |
| 4,626,075 | 12/1986 | Chemla et al. | 350/354 |
| 4,705,361 | 11/1987 | Frazier | 350/355 |
| 4,737,003 | 4/1988 | Matsumura | 350/355 |
| 4,739,385 | 4/1988 | Bethea | 357/22 A X |
| 4,755,857 | 7/1988 | Abstreitner | 357/22 A |
| 4,758,868 | 7/1988 | Frijlink | 357/22 A |

FOREIGN PATENT DOCUMENTS

| | | | |
|---|---|---|---|
| 0233011 | 8/1987 | European Pat. Off. | 350/355 |
| 0289671 | 12/1986 | Japan | 357/22 MD |
| 85103171 | 7/1985 | World Int. Prop. O. | |

OTHER PUBLICATIONS

Yokoyama et al., "Tunneling Hot Electron Transistor Using GaAs/AlGaAs Heterostructures", *Japanese Journal of Applied Physics*, vol. 23, No. 5, May 1984, pp. L311-L312.
"Guided-Wave Devices for Optical Communication," Rod C. Alferness, IEEE Journal of Quantum Electronics, vol. QE-17, No. 6, pp. 946-959, Jun. 1981.
"Wave Guide Electrooptic Modulators," Rod C. Alferness, IEEE Transactions on Microwave Theory and Techniques, vol. MTT-30, No. 8, pp. 1121-1137, Aug. 1982.
"Switching Characteristics of GaAs Directional Coupler Optical Switches:," Hiroaki Inoue et al., Applied Optics vol. 25, No. 9, pp. 1484-1490, May 1, 1986.
"Multigigahertz Lumped—Element Electrooptic Modulators," Richard A. Becker, IEEE Journal of Quantum Electronics, vol. QE-21, No. 8, pp. 1144-1146, Aug. 1985.
"GaAs-GaAlAs Y-Branch Interferometric Modulator", P. M. Rodgers, Proceedings of the Third European Conference, ECIO '85, pp. 117-120, Berlin, Germany, May 6-8, 1985.
"GaAs Electro-Optic Channel-Waveguide Modulator", J. C. Campbell et al., Applied Physics Letters, vol. 26, No. 11, pp. 640-642, Jun. 1, 1975.
"InGaAsP/InP Monolithic Integrated Circuit With Lasers and an Optical Switch," S. Sakano et al., Electronics Letters vol. 22 No. 11, pp. 594-596, May 22, 1986.
"High-Extinction AlGaAs/GaAs Waveguide Modulator," C. M. Gee et al., Integrated and Guided-Wave Optics Topical Meeting. Paper THAA3, Atlanta, Ga., Feb. 26-28, 1986.

(List continued on next page.)

Primary Examiner—Eugene R. LaRoche
Assistant Examiner—Nathan W. McCutcheon
Attorney, Agent, or Firm—James W. Falk

[57] ABSTRACT

High speed optoelectronic devices which are suitable for use in an optical integrated circuit design. The devices comprise a monolithic planar structure wherein exciton-resonant light propagates along a single mode waveguide containing a single quantum well as the absorbing media. Optical absorption is controlled by the bleaching effect induced by free carriers whose electrical conduction makes possible optical detection and monolithic high speed, gate-controlled transistor structures.

19 Claims, 4 Drawing Sheets

OTHER PUBLICATIONS

"100 ps Waveguide Multiple Quantum Well (MQW) Optical Modulator with 10:1 On/Off Ratio," T. H. Wood et al., Electronics Letters Vol. 21 No. 16, pp. 693–694, Aug. 1, 1985.

"The Quantum Well Self-Electrooptic Effect Device: Optoelectronic Bistability and Oscillation, and Self-Linearized Modulation," D. A. B. Miller et al., IEEE Journal of Quantum Electronics, vol. QE-21, No. 9, pp. 1462–1476, Sep. 1985.

"Quantum-Well Charge-Coupled Devices for Charge-Coupled Device-Addressed Multiple-Quantum-Well Spatial Light Modulators," W. D. Goodhue et al., Journal of Vacuum Science and Technology, vol. B4, No. 3, pp. 769–772, May/Jun. 1986.

"Observation of the Excited Level of Excitons in GaAs Quantum Wells," R. C. Miller et al., Physical Review B, vol. 24, No. 2, pp. 1134–1136, Jul. 15, 1981.

SINGLE QUANTUM WELL OPTICAL MODULATOR

FIELD OF THE INVENTION

This invention relates to semiconductor devices for controlling light in waveguiding structures and more particularly to optical modulators useful, for example, as a field effect transistor optical modulator, an optically readable memory element and an optical switch.

DESCRIPTION OF THE PRIOR ART

Conventional devices for high-speed amplitude modulation of single-mode-waveguided light are based on several known design principles, namely; the electro-optic effect directional coupler switch, the electro-optic effect interferometric (or Mach-Zehnder) modulator, the electro-optic effect mode-confinement modulator, the free-carrier-effect total-internal-reflection switch, and the electroabsorption (or Franz-Keldysh) effect modulator. Waveguide modulators based on these principles provide modulation of light by an electric signal and with the exception of the electroabsorption effect modulator are not able to provide any other photoelectronic signal processing functions such as electrical detection of a light signal, electrical amplification, or optically-controlled switching of an optical signal. Generally, the relative performance of optical modulators may be gauged according to several accepted figures of merit including (1) the switching voltage, (2) device bandwidth (or speed) based on its capacitance, (3) the switching voltage per bandwidth $V/\Delta f$, (4) the power per bandwidth $P/\Delta f$, and (5) physical device size as described by R. C. Alferness in his articles "Guided-Wave devices for Optical Communications," published in the IEEE Journal of Quantum Electronics, Vol. QE-17, page 946, June 1981, and "Waveguide Electrooptic Modulators," published in the IEEE Transactions on Microwave Theory and Techniques, Vol. MTT-30, page 1121, August 1982.

Those devices which are based on the electro-optic effect can be fabricated on both $LiNbO_3$ and semiconductor substrates. The electro-optic effect is characterized by an ability to alter the refractive index of a material in response to an applied electric field. The electric field is created by application of a voltage to a device structure. Since the electro-optic effect is inherently fast, speed can be high, limited only by the device capacitance and the ability to provide the necessary large voltages and powers at high speeds.

To realize amplitude modulation using this refractive index change, three main device structures have emerged. In each case, regardless of the choice of material, these devices require switching voltages and furthermore are often physically long. For example, the electro-optic directional coupler switch described by H. Inoue et al. in their article "Switching Characteristics of GaAs Directional Coupler Optical Switches," published in Applied Optics, Vol. 25, page 2484, in May 1986 requires 22.5 volts to switch and has an active region 9 mm in length. Similarly, directional coupler switches based on $LiNbO_3$ requiring 14 volts have been described by R. A. Becker in his article, "Multigigahertz Lumped Element Electrooptic Modulators," published in the IEEE Journal of Quantum Electronics, Vol. QE-21, page 1144, in 1985. Yet, both of these switches operate near their theoretical optimum, subject to design goals.

Similarly, as described by P. M. Rodgers in his article "GaAs-GaAlAs Y-branch Interferometric Modulator," appearing on page 117 in the book "Integrated Optics (Proceedings of the Third European Conference, ECIO '85), "H. -P Nolting, Ed. (Springer-Verlag, Berlin 1985), his semiconductor interferometric modulators require 14.6 volt switching voltage and are 7 mm in length. This and the previous two electro-optic devices operated at speeds in the range above 1 GHz and below 5 GHz. An electro-optic effect mode-confinement modulator of approximately 5 mm length requiring 40 volts to switch was described by J. C. Campbell et al. in their article "GaAs Electro-Optic Channel-Waveguide Modulator," in Applied Physics Letters, Vol. 26, page 640, in June 1975. However, its operating bandwidth was limited to 150 MHz. The voltage per unit bandwidth for the four electro-optic effect devices cited above is greater than 1 V/GHz, and the power per unit bandwidth greater than 300 mW/GHz. The latter indicates that large driving powers over 1 watt would be necessary to operate these devices at the high speeds which are of greatest interest for most applications. The large voltages and large physical lengths typical of these devices are additionally disadvantageous for integration into planar waveguide integrated optical circuits. Switching voltages of 1 volt or less with capacitance of 1 pF or less and lengths of 500 microns or less are highly desirable for optical integration. Some prior art devices, e.g. total-internal-reflection switches operate on the free-carrier-effect, also called the plasma effect, in which the presence of free carriers in a semiconductor reduces the index of refraction. The carriers for these switches are provided by injecting current into an interaction region at the intersection of the two waveguides. When the index is sufficiently depressed, total internal reflection results, switching the optical signal incident from one waveguide into the other waveguide. This design has the disadvantage of requiring regrowth of semiconductor layers to confine the injected carriers and is characterized by low speed and dissipation of power owing to carrier recombination in the active region. These properties are described by Sakano et al. in their article "InGaAsP/InP Monolithic Integrated Circuit with Lasers and an Optical Switch," in Electronics Letters, Vol. 22, page 594 (May 1986).

Conventional semiconductor optical modulators also exploit the electroabsorption (or Franz-Keldysh) effect both in the bulk and in two-dimensional confined structures (where it is also called the quantum-confined Stark effect) to amplitude modulate an incident guided optical wave. According to the electroabsorption effect, the optical absorption spectrum of the semiconductor material is shifted by application of an electric field. As a result, an optical signal at a wavelength of little absorption in equilibrium may pass unattenuated with no electric field, but experience absorption when a high electric field is applied. C. M. Gee et al. describe such a modulator in the bulk in their extended abstract "High-extinction· AlGaAS/GaAs Waveguide Modulator," published in the technical digest of the Topical Meeting on Integrated and Guided Wave Optics, Paper ThAA3, Atlanta, Ga., Feb. 1986. They achieved a switching voltage of 5 volts with a $V/\Delta f$ of 0.78 V/GHz and $P/\Delta f$ of 39 mW/GHz. Which such performance is superior to that of electro-optic effect devices, these figures are still too large for the purposes of optical integration.

There has been a recent growth of interest in exploiting the optical properties of free excitons in quantum wells which arise from a pronounced room temperature absorption at the exciton wavelength. This has resulted in optical modulators operating on the principle of the quantum-confined Stark effect. Such structures attempt to take advantage of the quantum confinement of carriers in semiconductor heterostructures to attain greater sensitivity of the electroabsorption spectral shift to the applied voltage as compared to the bulk devices. Such a device is described by Chemla et al. in U.S. Pat. No. 4,525,687 as a multiple layer heterostructure semiconductor apparatus including means for applying an electric field to the structure to vary its optical absorption coefficient and index of refraction. It is adapted for use as an optical absorption, phase or polarization modulator as well as other uses. An embodiment of the absorption modulator is described by T. H. Wood et al. in their article "100 ps Waveguide Multiple Quantum Well (MQW) Optical Modulator with 10:1 On/Off Ratio," published in Electronics Letters, Vol. 21, page 693, Aug. 1985. They demonstrate a switching voltage of 15 volts, with a capacitance of 0.93 pF and a length of 150 microns in a multimoded waveguide structure. The figure of merit $V/\Delta f$ is 2.2 V/GHz and $P/\Delta f$ is 330 mW/GHz. Such devices would require excessive power to drive at the high speeds needed for optoelectronic integration.

It would be desirable to employ structures operable at a voltage which is an order of magnitude less than these prior art structures, while having short lengths, low drive power, low drive voltage, large extinction ratios and low optical losses. The conventional devices do not provide any active electrical amplification or switching functions. Therefore, their uses in communications systems are limited. It is also desirable to employ structures with a capacitance of no more, and preferably less than 1 picofarad. The present invention enables one to achieve such structures.

Other multiple quantum well devices based on the quantum-confined Stark effect operate in non-planar, non-waveguiding modes are described for example by D. A. B. Miller et al. in their article "The Quantum Well, Self-Electrooptic Effect Device," published in the IEEE J. of Quantum Electronics, Vol. QE-21, page 1462, in 1985. Such devices are non-planar and non-waveguiding and are not applicable for devices which can be incorporated as part of a monolithic integrated optical circuit.

Another class of devices constituting prior art with respect to the present invention are those providing an optically-readable memory function. Goodhue, et al., in their article "Quantum Well Charge-Coupled Devices for Charge-Coupled Device-Addressed Multiple-Quantum-Well Spatial Light Modulators," published in the Journal of Vacuum Science and Technology, Vol. B4, page 769, in 1986, describe their application of multiple quantum well modulators to a charge-storage structure. In such a structure the storage of charge in a semiconductor layer of lower bandgap than surrounding layers provides an electric field in the volume of a multiple quantum well structure. The application of such an electric field brings about the quantum-confined Stark effect which as described above is capable of modifying the optical absorption spectrum. With an optical source of appropriate wavelength, it is impossible to determine the presence of absence of stored charge in the lower-bandgap semiconductor layer. Such a device is optically nonplanar such that the optical reading signal is not contained within a waveguide in the semiconductor layer. Rather, the optical reading beam must be directed through free space to reach the specific memory element to be read. Thus this device is not appropriate for planar monolithic integrated optical circuits. Another class of devices constituting prior art with respect to the present invention are those performing an all-optical function, for example, one in which an optical signal can be used to modulate a second optical signal. Non-waveguiding devices have not been treated in depth as part of the previous discussion, due to the fact that the present invention is a waveguided structure. However, since conventional all-optical devices, which are also non-waveguiding, must be considered to be the closest prior art in that the present invention also employs optical modulation of an optical signal, such devices will be discussed herein as well. Conventional nonlinear optical bistable devices have been made using heterojunction semiconductor materials. These devices are characterized by an operating point determined by the optical cavity gain.

These nonlinear optical devices exhibit particular aspects such as bistability, amplification, photonic modulation or the like. A problem with this type of nonlinear optical device is that the operating point is selected by the choice of materials and other design parameters during fabrication of the device. Therefore, the operating point cannot conveniently be controlled at the time the device is in use.

A nonlinear modulator described by Chemla et al. in U.S. Pat. No. 4,528,464 addresses a problem of low third order nonlinear susceptibility in previous devices. Such low values made it impractical to utilize a diode laser light source. The proposed solution was the use of a multiple quantum well (MQW) structure in the design of a degenerate four-wave mixer. The proposed structure could be tuned to exciton absorption peaks lying at photon energies employed in communication systems. Tuning was permanent, e.g. by fixing the composition of the materials to achieve a desired bandgap or by fixing the thickness of a narrow bandgap element of the device to a specific exciton binding energy. The structure generally requires a multiplicity of layers (in the order of 100–200 Å each) of narrow bandgap compounds to obtain the necessary optical absorption for device design.

In other devices described by Chemla in U.S. Pat. Nos. 4,549,788 and 4,626,075 a semiconductor optical modulator is controlled by a light beam. In the device mentioned in the first patent, a multilayered semiconductor structure of varying bandgap materials has a variable input light source impinging thereon with an E field component polarized normal to the layers. The intensity of this input beam controls charge trapped in the layers, the dielectric constant of these layers and consequently the propagation of the light beam within the device. In the device of the latter mentioned patent, a semiconductor structure similar to that in the previously mentioned device has a constant intensity light beam applied thereto. A separate control light beam orthogonal to the constant intensity beam impinges on the semiconductor layers and varies the trapped charge, thereby varying the propagation of the constant intensity beam.

SUMMARY OF THE INVENTION

A high speed optical modulator which is controllable through electrical means is provided. The novel device comprises free carriers in a planar single quantum well (SQW) having a planar waveguide configuration coextensive with and overlapping SQW, and means for electrically altering the free carrier density in the SQW. The invention includes optical systems employing such modulators as well as the method of optical modulation and is suitable for use in both amplitude modulation (at the exciton absorption wavelength) as well as phase modulation (at wavelengths longer than the exciton absorption peak).

DETAILED DESCRIPTION OF THE INVENTION

Figure 1:
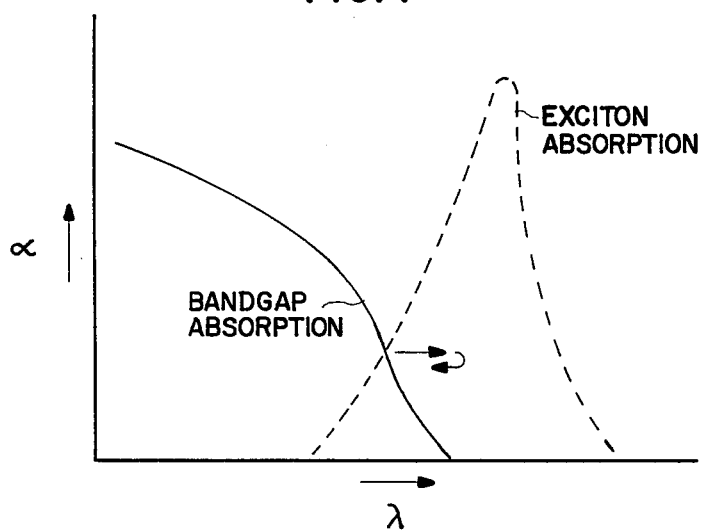
FIG. 1 is a graphical representation of absorption coefficient $\alpha$ vs. wavelength $\lambda$ showing the effect of the presence of free carriers upon the exciton absorption.

Generally, the optical modulators which form part of the optical systems described herein employ the effect of bleaching (change in concentration) of free carriers in a quantum well to obtain a change in the absorption coefficient of the modulator to an input beam of a specific wavelength to be modulated (amplitude modulation). The input beam wavelength corresponds to and lies within the exciton absorption wavelength band. Alternatively, when the input wavelength is longer than the exciton wavelength, one can make use of a corresponding change in refractive index with a change of free carrier concentration to obtain phase modulation of the input beam. The effect of the change in free carrier concentration on the exciton absorption band can readily be seen with reference to FIG. 1. Here the absence of the absorption peak of the exciton band is readily observed in the presence of free carriers (solid line). Upon bleaching (e.g. by increase in free carrier concentration), the exciton absorption band disappears. The free carrier concentration in the novel structures is controlled by application of a small applied voltage, typically on the order of 0.5 to 3 volts, to the novel structures.

Typically a field effect transistor optical modulator in accordance with our invention has a planar single quantum well (SQW) structure comprising a plurality of semiconductor epilayers wherein the strong absorption coefficient characteristics of semiconductor materials at wavelengths shorter than the absorption edge corresponding to the bandgap, e.g. $10^4 cm^{-1}$, affects only a small fraction of the optical wave. As opposed to a multiquantum well (MQW) approach, the SQW offers the opportunity to make an FET-like structure wherein the SQW acts as a FET channel, and a parallel electrode, such as a metal or highly doped semiconductor gate, can control the carrier density in the channel.

Figure 2:
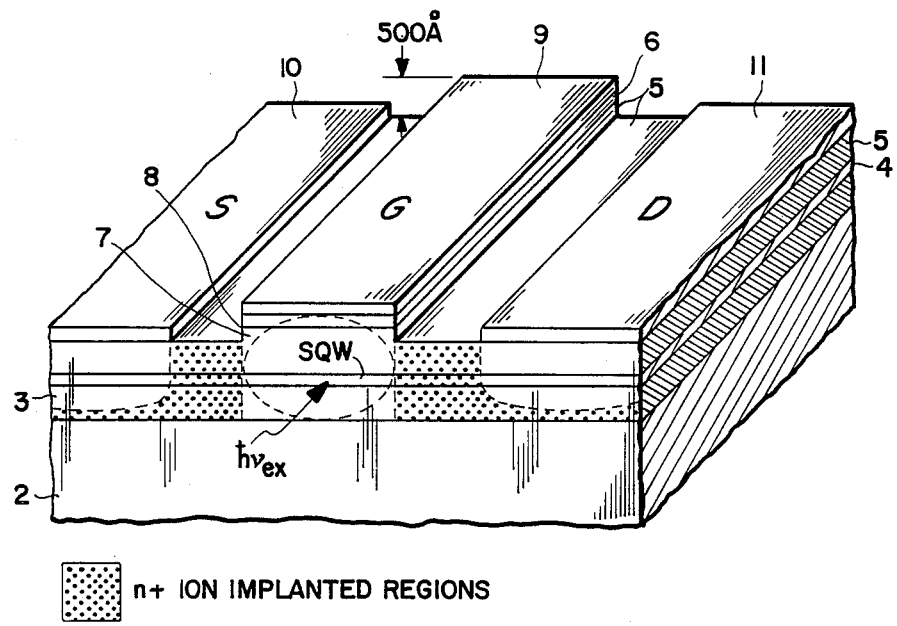
FIG. 2 is a partially cross-sectional isometric view of a field effect transistor optical modulator (FETOM) in accordance with one embodiment of our invention.
Figure 3:
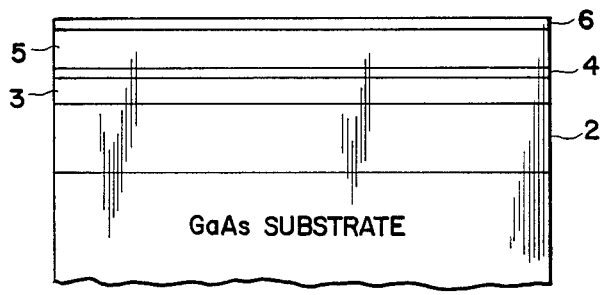
FIG. 3 is a side elevational view of a FETOM of the type shown in FIG. 2 showing the waveguiding layers.
Figure 4:
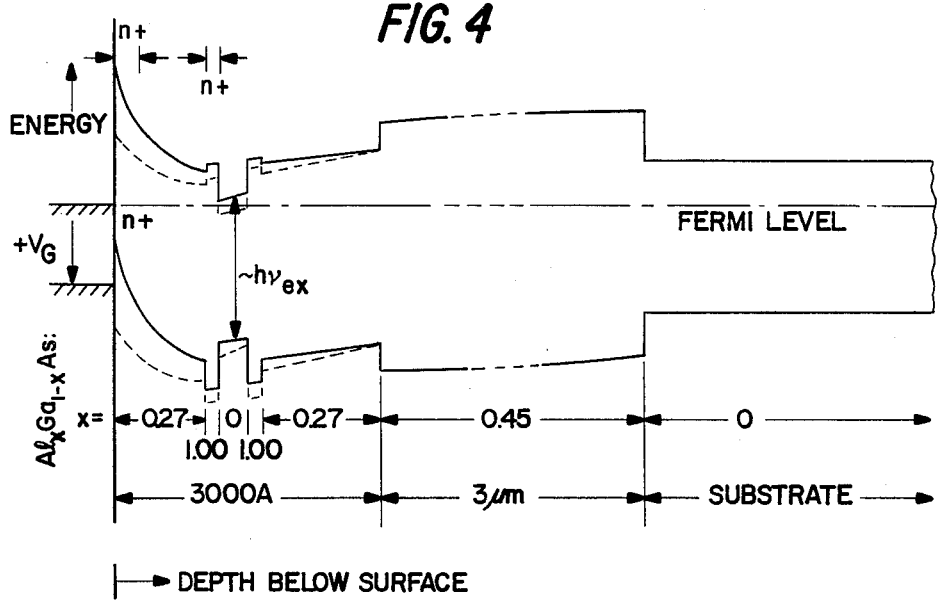
FIG. 4 is an epilayer and energy band diagram as a function of depth from the surface into a sequence of semiconductor epilayers of a SQW field effect optical modulator (FETOM) in accordance with our invention.

An exemplary FETOM structure useful as a switch is shown with reference to FIGS. 2 and 3 and its energy band structure and composition as a function of depth below the surface is shown with reference to FIG. 4. As shown, the device comprises a semiconductor substrate, e.g., single crystal GaAs, onto which are formed a plurality of layers of various composition. These layers are preferably formed by epitaxial growth, but other means known to the art may also be employed. The first layer 2 which is about 3 microns in thickness is comprised of $Al_xGa_{1-x}As$ wherein x is about 0.47. This layer functions as a waveguide cladding layer. Above the first layer 2 is formed a second layer 3 of $Al_xGa_{1-x}As$ wherein x is about 0.27 and a thickness in the order of 1700 Å. Above this second layer 3 is a 100 Å thick layer 4 of GaAs which forms the SQW. Over the GaAs layer 4 is an upper layer 5 of $Al_xGA_{1-x}As$ wherein x is about 0.27. The structure further includes a 200 Å doped layer of 6 over layer 5 and which lies in a central band 7 of the device. The top layer 6 extends about 500 Å above the remainder of the structure's surface to form a rib (or ridge) capable of confining the planar optical mode in the transverse direction to define an optical waveguide. It should be understood that other waveguide structures as will be obvious to those skilled in the art are also suitable. The thickness of layer 5 in the region of the waveguide rib is about 800 Å. while the remainder of layer 5 is about 500 Å thick. In regions exclusive of the rib which defines the SQW waveguide, layer 5 and portions of the layers underlying it are doped n+ by ion implantation. The central band 7 is typically between about 1 and 5 microns wide. The device is typically 100 to 250 microns long (front to back, as shown). The thin, 200 Å layer 6 is doped n+ to shield the surface action and to flatten the conduction band in the region of the 100 Å GaAs SQW layer 4. The separation of the SQW layer 4 from the surface by upper layer 5 takes advantage of the large optical intensity at that depth. The lower $Al_{0.27}Ga_{0.73}As$ layer 3 and the layer of $Al_{0.47}Ga_{0.53}As$ which functions as a waveguide cladding layer are designed to support a single optical mode at the wavelength of exciton resonance. The single optical mode is confined within 1 micron. As shown, the left portion of the device serves as the source, S, the central band 7, is the gate, G, and the right portion is the drain, D, of the FETOM. Ohmic metal contacts are provided for the source, S, and drain, D, respectively, The gate, G, is provided with a Schottky barrier electrode and an applied voltage at the gate can control the carrier density and hence optical absorption at the exciton wavelength in the channel. A highly doped semiconductor region can replace a metalized Schottky gate to reduce optical absorption losses. Alternatively, any dielectric material of lower refractive index than $Al_{0.27}GA_{0.73}As$ can be incorporated between the waveguide and the Schottky barrier metalization to reduce optical absorption losses.

Calculations based upon the effective index approximation show that the power filling factor $\Gamma$ in this 100 Å SQW is about 0.018 for this structure. It will be obvious to those skilled in the art that other compositions and layer thicknesses can be employed to obtain devices operable at different wavelengths of exciton resonance.

The essential part of the FETOM is the SQW. While absorbing waveguided bandedge-resonant light, it simultaneously serves as the two-dimensional electron gas channel of an undoped heterojunction transistor. In one particular embodiment, the active region of the quantum well channel is defined by a 3 micron wide, 500 Å high rib 8 which confines the optical single mode laterally. At the same time, a metalization layer 9 on the top of the rib acts as a Schottky gate contact. Ohmic metal for source and drain contacts 10 and 11 is alloyed with the underlying ion implanted layers which lie adjacent to the rib 8, contacting the SQW. With no bias applied to the gate, the SQW conduction band is flat and slightly above the Fermi level, allowing the characteristically strong absorption at the exciton wavelength to affect the guided wave. Applying a relatively small positive voltage between the gate and channel will fill the channel and, as discussed below, sharply reduce the optical absorption at the exciton wavelength.

Next we examine the room temperature dependence of the absorption constant, alpha, on the 2D carrier density in the SQW, $n^{2D}$, for the purpose of calculating the performance of the FETOM as a waveguide modulator. Although difficult to find an exact theoretical solution, it is possible to estimate the effect in the limits of low and high carrier density. The physical mechanism of free-carrier-induced exciton bleaching comprises two processes, namely: (1) band filling (blocking) and (2) modification of the electron-hole interaction by both coulomb screening and exchange effects. Band filling (i.e., occupation of conduction band states by free electrons) reduces the absorption by diminishing the phase space available for exciton creation. Modifying the electron-hole interaction also reduces the oscillator strength by weakening the coulomb attraction until electron and holes ultimately become unbound. For small 2D free carrier concentration $n^{2D}$, the dependence of alpha on $n^{2D}$ may be expressed $\Delta\alpha/\alpha = n^{2D}/N_s$, valid up to $n^{2D} \sim N_s$. Taking both effects into account, Schmitt-Rink et al. calculated $N_s = 0.117(\pi a^2_{2D})^{-1}$ at 300 K electron-hole plasma bleaching. Using the 9 meV binding energy of a 100 Å quantum well as experimentally observed by R. C. Miller et al. in their article "Observation of the Excited Level of Excitons in GaAs Quantum Wells" published in Physical Review B, Volume 24, page 1134, in 1981, to estimate a 2D exciton radius $a_{2D}$ of 65 Å, and including a factor of two to account approximately for the absence of holes in the case of the FETOM, we find $N_s$ is approximately $2 \times 10^{11} cm^{-2}$, equivalent to a bulk concentration of $2 \times 10^{17} cm^{-3}$. The electric field corresponds to a sheet charge of $n^{2D} = 2 \times 10^{11} cm^{-2}$ is $2.7 \times 10^4$ V/cm, which is small compared to the field required to achieve transparency based on the QCSE of $\sim 1 \times 10^5$ V/cm as reported in the literature. At densities $n^{2D} = N_s$, complete absorption saturation cannot be predicted primarily because of the phenomenon of band-gap renormalization in which the absorption band edge moves to lower energies with increasing carrier concentration. However, for $n^{2D} = N_s$ it may be approximated that at the exciton wavelength the exciton absorption is largely eliminated, leaving only the (renormalized) band-to-band absorption. Since at room temperature, the 2D exciton absorption appears approximately twice as large as the background band-to-band absorption, a significant change in alpha of perhaps 50% may be expected at $n^{2D} = 2 \times 10^{11} cm^{-2}$. More experimentation is needed to measure the precise amount of bleaching at these densities, particularly in the present case where only one species (e.g., electrons) is present.

Further bleaching at 300 K may be achieved by filling the conduction band with electrons to the desired fractional occupation necessary to block the band-to-band absorption. By integrating the Fermi distribution function times the density of states (constant for 2D), it is found that in a GaAs SQW, $n^{2D} = 5 \times 10^{11} cm^{-2}$ bleaches 50%, $1 \times 10^{12} cm^{-2}$ bleaches 75%, and $2 \times 10^{12} cm^{-2}$ bleaches 93% of the band-to-band absorption (taking the effective mass $m^* = 0.07 m_e$, where $m_e$ is the electron mass). These numbers are obtained by calculating the fractional occupation number at the bottom of the two-dimensional band. Thus, including exciton bleaching we estimate $\Delta\alpha/\alpha = 0.9$ for $n^{2D} = 1 \times 10^{12} cm^{-2}$. These estimates of the two-dimensional Moss-Burstein effect neglect bandgap renormalization and Stark effects lower the bandgap and thus will lead to slightly higher $n^{2d}$.

With those estimates, the anticipated performance of a FETOM having a 3 micron wide waveguide and 1000 Å gate-to-channel separation may be roughly estimated as follows:

Taking $\Gamma = 0.02$, the effective absorption coefficient $\alpha' = \alpha\Gamma 200$ cm$^{-1}$. Assuming $\Delta\alpha/\alpha = 0.9$ at $n^{2D} = 1 \times 10^{12} cm^{-2}$, it is possible to achieve 10 dB extinction with 1 dB insertion loss at a device length (i.e., FET width) of w = 125 microns. For the 1000 Å separation, d, of the 3 micron gate from the SQW, the gate-channel capacitance $C_{gs} = 0.45$ pF. The gate-channel voltage, $V_{gs}$, necessary to sustain $n^{2D} = 1 \times 10^{12} cm^{-2}$ is 1.35 volts. The minimum RF power required by such a modulator when driven by a system containing no energy storage elements is 0.41 mW/GHz, based on the power necessary to repeatedly charge $C_{gs}$ to 1.35 volts ($=\frac{1}{2}C_{gs}V^2_{gs}$). The $C_sV_s$ product of a figure of merit $V/\Delta f = 2 2\pi RC_{gs}V_{gs}$ where R = 50 $\Omega$ of 0.19 V/GSz. Based on these modulator figures of merit, the FETOM compares well with other devices demonstrated to date.

A high switching speed is expected, which may be estimated based on the similarity of the FETOM to other two-dimensional electron gas FET's such as the MODFET. As presented here, the FETOM is an enhancement-mode transistor, with $n^{2D}$ [cm$^{-2}$] $= 7.5 \times 10^{10} \times V_{gs}$[volts]/d[microns] where the threshold voltage has been taken as 0 volts. In operation, the device could be biased with $V_{gs} = 0$ in the opaque state, with sufficient source-drain voltage for velocity saturation in the channel. For a MODFET with saturation velocity $v_s = 2 \times 10^7$ cm/sec, giving (for L = 3 microns) $\tau_{transit} = 15$ psec. For comparison, the RC charging time $\tau_{RC}$ for R = 50 $\Omega$ is 22 psec, so in this case the device speed is determined by RC, giving a 3 dB bandwidth of approximately 7 GHz. If speed in a 50 $\Omega$ system is the most important criterion, a greater separation between gate and SQW can reduce capacitance and increase speed at the expense of driving power.

As it combines electrical and optical properties, the FETOM (which as described here also acts as an enhancement mode FET) offers unusual versatility for optoelectronic integrated circuits. In addition to acting as an optical modulator, it also functions as a high speed transistor or optical waveguide detector. The required $2\times10^{11}$ cm$^{-2}$ SQW carriers can be induced equally well by excitonic optical absorption of a few mW (for the gate controlled operations incident optical power should be kept below this level), which may then be detected through their contribution to source-drain conductance. By using two FETOM's as the active transistors in a conventional bistable multivibrator circuit, it is possible to switch from one state to the other through optical excitation alone.

Figure 5:
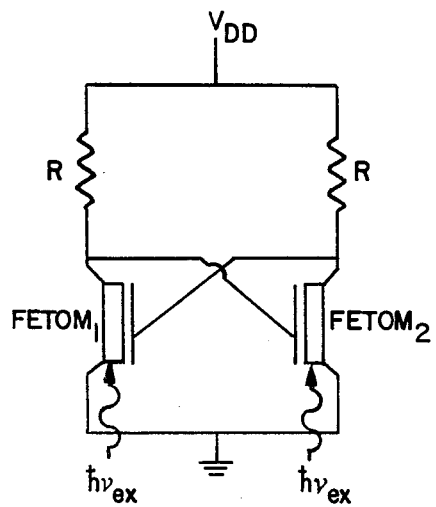
FIG. 5 is an optoelectronic switching circuit employing FETOM optical modulators in accordance with our invention.

Consider now the optoelectronic circuit of FIG. 5, in which we assume initially FETOM1 is in the "off" state (optically opaque). As the optical input to FETOM1 is increased, its source-drain resistance decreases, reducing the gate voltage $V_{g2}$ applied to FETOM2. The latter device, originally in the "on" state (i.e., optically transparent) owing to the presence of positive $V_{g2}$, is then switched to the "off" state which in turn electrically switches FETOM 1 to the "on" state through application of positive voltage $V_{g1}$ to its gate. Thus switching can be accomplished without any microwave-quality electrical input or output. This represents DC-powered but otherwise all optical logic in a monolithic form suitable for planar integration. Relying on the inherent flexibility of electronics any number of other such FETOM circuits can be devised, including those exhibiting hybrid optical bistability.

Figure 6:
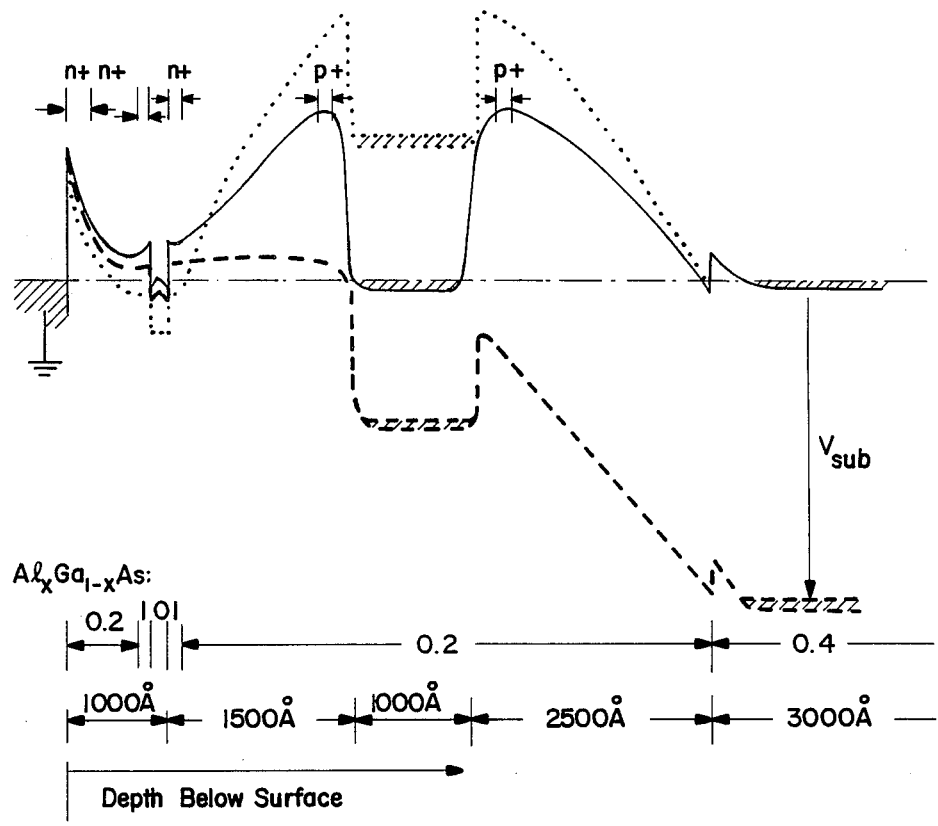
FIG. 6 is a diagram showing the structure and the effect of an applied bias on the energy band levels of a FETOM-like device as a function of depth below the surface in an embodiment of our invention useful as an optically readable memory element.

The next device we wish to introduce is the optically-readable memory element which incorporates a long-term charge storage element with the SQW. Optical modulation is effected by storage of free electrons either in the SQW (transparent state) or in a separate floating n+ Al$_{0.2}$Ga$_{0.8}$As layer (opaque state). The epilayer structure and energy band diagram are shown in FIG. 6.

The top layers including the SQW are essentially the same as for the FETOM except that a concentration of electrons ($1\times10^{12}$cm$^{-2}$) is normally present in the SQW, rendering this device normally transparent. A new feature is an n+ Al$_{0.2}$Ga$_{0.8}$As layer separated by a p-type planar doped potential barrier to electron flow from the SQW. Electrical contact is made by ohmic metal to the substrate and Schottky metal at the surface. With no bias applied (solid line, FIG. 6), the SQW is transparent at the exciton wavelength because of the aforementioned free carrier screening and band filling effects. In the present device these result from electron transfer to the QW from the adjacent n+ Al$_{0.2}$Ga$_{0.8}$As layers. As shown in FIG. 6, it is possible to move electrons from the SQW to the n+ Al$_{0.2}$Ga$_{0.8}$As floating layer (inducing opacity) by applying a positive bias to the substrate (dashed line), storing them there almost indefinitely once the bias is removed (dotted line). We estimate the retention time to be $10^9$ seconds (30 years) for an equilibrium barrier height of 1.5 eV. We can equally well return the system to the initial transparent state by applying negative bias to the substrate.

In another configuration, it is possible to contact the SQW directly and measure its conductivity for simultaneous electronic processing.

To minimize hole leakage of photogenerated holes, an AlAs layer is provided adjacent to the SQW which presents a 0.6 eV barrier height to holes, leading to a hole leakage time of $10^{-4}$ which is 5 to 6 orders of magnitude slower than recombination processes. At the same time the barrier height to electrons is 0.15 eV which does not impede electron transfer at room temperature. The intrinsic device speed, to be modified by RC and light propogation delay considerations, is 1 psec based on transit effects.

Figure 7:
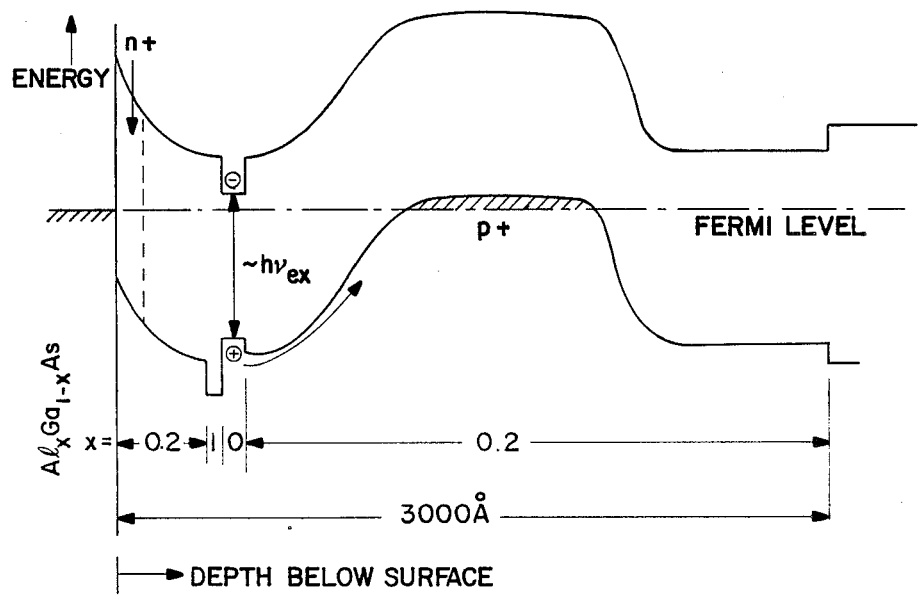
FIG. 7 is a diagram showing the structure and energy band levels vs. depth below the surface of an embodiment of our invention useful as an optically switched charge storage device.

The final device described here, the optically-switched charge storage device, is similar to the optically-readable memory element but relies on photoexcited carriers to induce exciton screening in a persistent state by spatial separation of induced carriers. In contrast to the previous device the band structure, shown in FIG. 7, is designed to facilitate the escape of photogenerated holes from the SQW to a p+ buried layer. Under illumination at the exciton wavelength photogenerated holes rapidly escape the SQW and are driven by the built-in field to the p+ layer while the electrons remain confined. For 0.15 eV barrier height (x=0.25) the electron-hole separation time may be estimated to be <1 psec based on thermionic emission. Consequently, the device will switch during illumination from opacity to a transparent state which persists even after the removal of light. To return the device to its initial state it is sufficient to apply a negative voltage pulse to the p+ layer relative to the Schottky barrier. In this case, the recovery time is controlled by the recombination rate $10^9$sec$^{-1}$. However, by electrically contacting the channel and the p+ buried layer to sweep carriers out, much faster transitions to the opaque state can be achieved.

The key feature of the optically-switchable charge storage device lies in its demonstration of a new mechanism for all-optical switching. This mechanism relies on combining the technique of bandgap engineering with the optical properties of direct gap semiconductors.

In conclusion, we have described several novel optoelectronic devised based on electrically controlled electron transfer into and out of SQW's, resulting in modulation of exciton-resonant optical absorption:

(1) the FETOM, in which a single mode rib waveguide functions both as the active region of an FET and as a highly drive-power-efficient optical modulator.

(2) The optically-readable memory element capable of long term (>1 year) electrical/optical data retention.

(3) The optically switchable charge storage device in which the charge storage is induced by optical excitation. In all cases, exciton bleaching arises when the electron density induced in the SQW is sufficient to provide band-filling and screening of the elctron-hole attraction. Electrical conduction phenomena associated with this electron density make possible a panoply of hybrid optoelectronic devices.

The devices described here have in common a planar waveguiding configuration, achieved through the use of multilayer heterostructures, e.g. Al$_x$Ga$_{1-x}$As heterostructures, whose only absorbing layer is the SQW, and in which the strong excitonic optical absorption is reduced by the power filling factor, typically a few percent. The deeply bound exciton energy in two-dimensional systems allows room temperature operation with extremely short delay times provided by an FET mechanism of charge modulation in the QW (15 psec), or even faster transfer between parallel layers ($-1$ psec).

Finally, we point out that the same waveguide device concepts are applicable to other material systems such as InGaAs/AlGaAs, which benefit from a lower effective mass m*.

While the foregoing description is illustrative of several embodiments of the invention, still other embodiments will be obvious to those skilled in the art and the scope of the invention is considered to go beyond the specific illustrated embodiments.

What is claimed is:

1. An optical modulator comprising a single quantum well (SQW) and a planar waveguide configuration coextensive with and overlapping said SQW for laterally confining light propagation through the modulator, said waveguide supporting light of a wavelength near or within the absorption wavelength band of excitons formed in said quantum well and monolithic field effect transistor means for altering the density of free carriers in said SQW.

2. The optical modulator recited in claim 1 further including optical means for altering said free carrier density.

3. The optical modulator recited in claim 1 wherein said monolithic field effect transistor (FET) means includes a source, a gate and a drain electrode, said SQW lying under said gate electrode and acting as an FET channel, application of a voltage to said gate electrode controlling free carrier density in said SQW.

4. The optical modulator recited in claim 3 wherein said modulator comprises a plurality of semiconductor layers forming heterojunctions.

5. The optical modulator recited in claim 4 wherein said semiconductor layers comprise of sequence of $Al_xGa_{1-x}As$ epilayers wherein x for each layer is selected such that the structure supports a single optical mode at or near the wavelength of exciton absorption.

6. The optical modulator recited in claim 4 wherein the layer in which said SQW is formed is GaAs.

7. The optical modulator recited in claim 4 wherein said waveguide is confined laterally by at least one semiconductor layer forming an elongated ridge extending above the surface of the remainder of said semiconductor layers.

8. The optical modulator recited in claim 3 wherein said gate is a Schottky gate.

9. An optical modulator comprising a plurality of semiconductor layers including a layer in which a single quantum well is formed in a specific region thereof, a planar optical waveguide for laterally confining light propagation through the modulator and which supports a single optical mode at or near the wavelength of exciton resonance, said single quantum well being coextensive with said waveguide, and monolithic field effect transistor means for altering the free carrier density in said single quantum well, said transistor means including a gate electrode for controlling the density of carriers in said quantum well.

10. The modulator recited in claim 9 wherein said waveguide is confined by an elongated ridge in a central region of said modulator and further comprising a gate electrode over said central region and a source and a drain electrode spaced from and on opposite sides of said gate electrode so as to enable electrical control of carrier density in said quantum well.

11. A bistable multivibrator circuit comprising a pair of field effect transistor optical modulators (FETOM's) as recited in claim 9 each having a source, a gate and a drain electrode said gate electrode associated with said quantum well for controlling the carrier density in said quantum well, means for applying a voltage to said FETOM's, said FETOM's coupled to each other and said voltage means such that a change in the electrical resistance between source and drain electrodes of one FETOM affects the gate voltage applied to the other FETOM so as to switch said other FETOM from a transparent state to an opaque state.

12. The circuit recited in claim 11 including optical means coupled to each FETOM for altering the resistance between source and drain of said FETOM.

13. An optically readable memory element comprising a device structure as recited in claim 9 wherein a concentration of electrons is normally present in said SQW and further comprising an n+ charge storage layer separated from said SQW by a p-type planar doped potential barrier and an ohmic contact to a single crystal semiconductor substrate on which active layers of said device are formed, and wherein with no bias voltage applied, the SQW is transparent at the exciton wavelength and upon application of a positive bias said SQW becomes opaque.

14. The memory element recited in claim 13 further including means for measuring the conductivity of said SQW.

15. The memory element recited in claim 13 further comprising a layer adjacent said SQW which provides a potential barrier to holes.

16. The memory element recited in claim 15 wherein said barrier layer is AlAs.

17. An optically switched charge storage device comprising a device structure as recited in claim 10 including a p+ buried layer adjacent said SQW into which photogenerated holes in said SQW can escape, means for illuminating said SQW at the exciton wavelength and a means for applying a constant field to said p+ layer such that said device switches from an opaque to a transparent state upon illumination and back again upon application of a negative pulse to said p+ layer relative to a gate electrode over said SQW.

18. The device recited in claim 17 including a conductor contacting said SQW and said p+ layer to sweep out carriers.

19. The device recited in claim 17 wherein said gate electrode is a Schottky electrode.

* * * * *